United States Patent
Yoon et al.

(10) Patent No.: US 10,622,785 B2
(45) Date of Patent: Apr. 14, 2020

(54) MICRO-VCSELS IN THERMALLY ENGINEERED FLEXIBLE COMPOSITE ASSEMBLIES

(71) Applicant: UNIVERSITY OF SOUTHERN CALIFORNIA, Los Angeles, CA (US)

(72) Inventors: Jongseung Yoon, La Crescenta, CA (US); Dongseok Kang, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 0 days.

(21) Appl. No.: 15/545,618

(22) PCT Filed: Jan. 29, 2016

(86) PCT No.: PCT/US2016/015689
§ 371 (c)(1),
(2) Date: Jul. 21, 2017

(87) PCT Pub. No.: WO2016/190919
PCT Pub. Date: Dec. 1, 2016

(65) Prior Publication Data
US 2018/0316158 A1    Nov. 1, 2018

Related U.S. Application Data

(60) Provisional application No. 62/109,771, filed on Jan. 30, 2015.

(51) Int. Cl.
*H01S 5/022*    (2006.01)
*H01S 5/183*    (2006.01)
*H01S 5/024*    (2006.01)
*H01S 5/42*     (2006.01)

(52) U.S. Cl.
CPC ...... *H01S 5/02476* (2013.01); *H01S 5/02236* (2013.01); *H01S 5/183* (2013.01); *H01S 5/423* (2013.01)

(58) Field of Classification Search
CPC ... H01S 5/02476; H01S 5/02236; H01S 5/183
USPC .............................................. 372/34
See application file for complete search history.

(56) References Cited

U.S. PATENT DOCUMENTS

| | | | |
|---|---|---|---|
| 6,549,556 B1* | 4/2003 | Hwang | H01S 5/18341 372/43.01 |
| 2002/0159491 A1* | 10/2002 | Jiang | H01S 5/18 372/45.01 |
| 2005/0116235 A1* | 6/2005 | Schultz | H01L 24/48 257/79 |
| 2005/0226302 A1* | 10/2005 | Lutgen | H01S 5/1835 372/70 |

(Continued)

OTHER PUBLICATIONS

International Search Report and Written Opinion for Application No. PCT/US2016/015689, dated Nov. 25, 2016, 12 pages.

(Continued)

*Primary Examiner* — Tuan N Nguyen
(74) *Attorney, Agent, or Firm* — Brooks Kushman P.C.

(57) ABSTRACT

A vertical cavity surface emitting laser (VCSEL) composite assembly includes a VCSEL, a substrate spaced from the VCSEL, and at least one metal layer disposed between the VCSEL and the substrate to facilitate efficient thermal management of the assembly.

26 Claims, 6 Drawing Sheets

(56) References Cited

U.S. PATENT DOCUMENTS

| | | | |
|---|---|---|---|
| 2005/0243886 A1* | 11/2005 | Wang | H01S 5/18377 372/98 |
| 2005/0243890 A1* | 11/2005 | Kim | B82Y 20/00 372/99 |
| 2007/0015313 A1 | 1/2007 | Kwak et al. | |
| 2008/0031294 A1* | 2/2008 | Krishnamoorthy | H01S 5/02453 372/34 |
| 2008/0128720 A1* | 6/2008 | Cho | H01L 33/10 257/95 |
| 2010/0051900 A1* | 3/2010 | Huffaker | B82Y 20/00 257/13 |
| 2012/0286884 A1 | 11/2012 | Dentale et al. | |
| 2014/0218898 A1 | 8/2014 | Seurin et al. | |
| 2015/0311673 A1* | 10/2015 | Wang | H01S 5/18355 372/27 |
| 2016/0240718 A1* | 8/2016 | Giziewicz | H01L 31/02327 |

OTHER PUBLICATIONS

International Preliminary Report for Application No. PCT/US2016/015689, dated Aug. 10, 2017, 9 pages.

Kang et al., "Compliant, Heterogeneously Integrated GaAs Micro-VCSELs towards Wearable and Implantable Integrated Optoelectronics Platforms", Advanced Optical Materials, 2014, 33 pages.

Wipiejewski et al., "Size-Dependent Output Power Saturation of Vertical-Cavity Surface-Emitting Laser Diodes", IEEE Photonics Technology Letters, vol. 8, O. 1, Jan. 1996, pp. 10-12.

Grabherr et al., "High-Power VCSEL's: Single Devices and Densely Packed 2-D-Arrays", IEEE Journal of Selected Topics in Quantum Electronics, vol. 5, No. 3, May/Jun. 1999, pp. 495-502.

Al-Omari et al., VSCELs With a Self-Aligned Contact and Copper-Plated Heatsink, IEEE Photonics Technology Letters, vol. 17, No. 9, Sep. 2005, pp. 1767-1769.

Al-Omari et al., "Low Thermal Resistance, High Speed, Top Emitting 980nm VCSELs", IEEE Photonics Technology Letters, 2006, 3 pages.

* cited by examiner

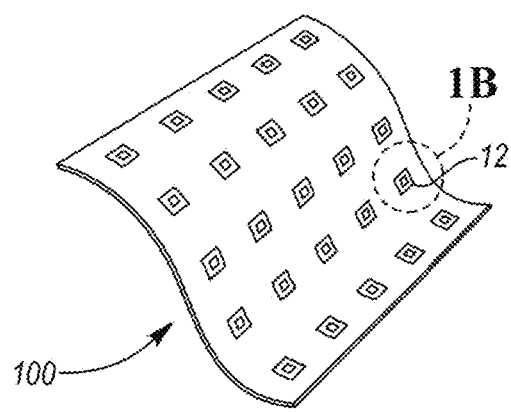
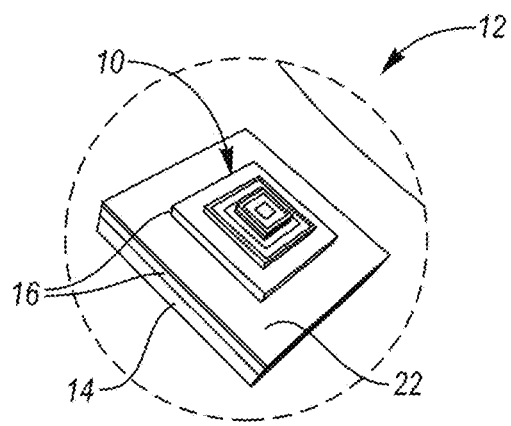
FIG. 1A  FIG. 1B
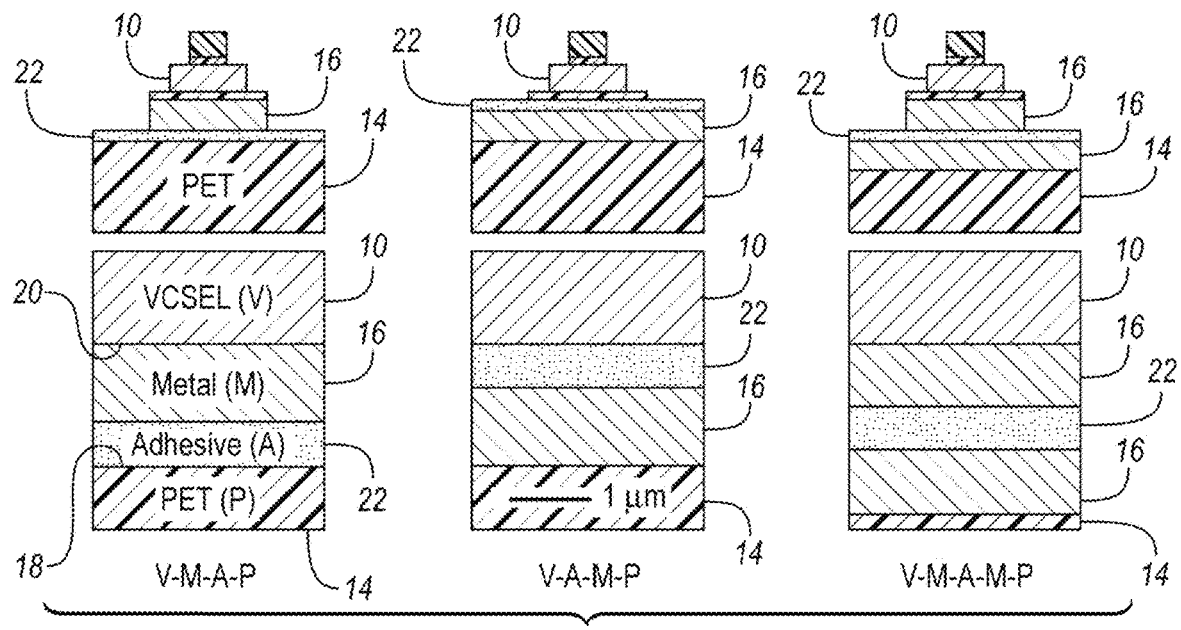
FIG. 1C
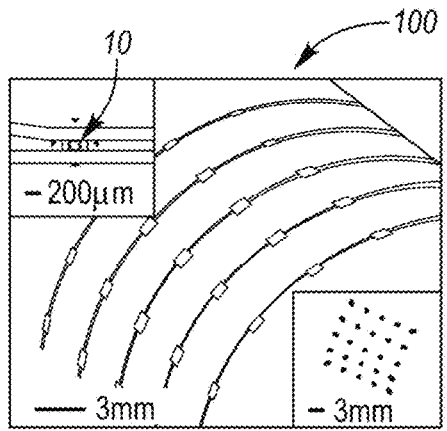
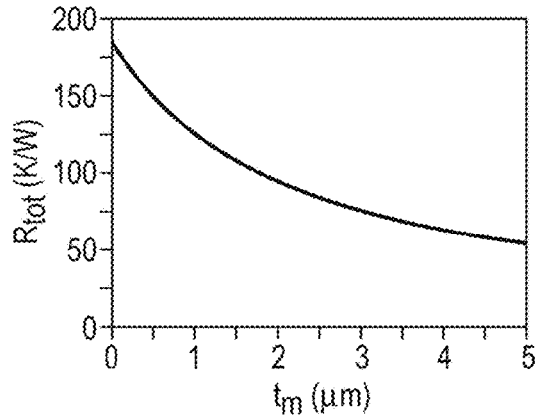
FIG. 1D  FIG. 7

MICRO-VCSELS IN THERMALLY ENGINEERED FLEXIBLE COMPOSITE ASSEMBLIES

CROSS-REFERENCE TO RELATED APPLICATIONS

This application is the U.S. national phase of PCT Application No. PCT/US2016/015689 filed on Jan. 29, 2016, which claims the benefit of U.S. provisional application Ser. No. 62/109,771 filed Jan. 30, 2015, the disclosure of which is hereby incorporated in its entirety by reference herein.

STATEMENT REGARDING FEDERALLY SPONSORED RESEARCH OR DEVELOPMENT

The invention was made with Government support under Contract No. N66001-12-1-4244 awarded by the Defense Advanced Research Projects Agency. The Government has certain rights to the invention.

TECHNICAL FIELD

Embodiments relate to micro vertical cavity surface emitting lasers (VCSELs) in flexible composite assemblies.

BACKGROUND

Vertical cavity surface emitting lasers (VCSELs) represent a versatile coherent light source that has made tremendous impacts on numerous modern technological applications including data communication, optical mice, laser printing, and, more recently, biomedical imaging and sensing, in which VCSELs provided many inimitable advantages over light emitting diodes or edge-emitting lasers including low power consumption, small beam divergence, circular beam profile, or facile integration into two-dimensional (2D), surface-emitting arrays (J. S. Harris et al., *Semicond. Sci. Technol.* 2011, 26; K. Iga, *Jpn. J. Appl. Phys.* 2008, 47, 1; K. Iga, *Proc. IEEE* 2013, 101, 2229; K. D. Choquette and H. Q. Hou, *Proc. IEEE* 1997, 85, 1730).

Although VCSELs in their conventional formats operating on their growth wafer have been successfully exploited over the past decades, the ability to incorporate VCSELs on non-native substrates and heterogeneously assemble them with dissimilar materials and devices into integrated systems hold great potential for a variety of unconventional utilities that are not available in traditional VCSEL technologies (C. Dagdeviren et al., *Nature Communications* 2014, 5; K.-I. Jang et al., *Nature Communications* 2014, 5; M. Kaltenbrunner et al., *Nature* 2013, 499, 458; D. Son et al., *Nat. Nanotechnol.* 2014, 9, 397; S. Xu et al., *Science* 2014, 344, 70).

In this regard, a recent work by Kang et al. (*Adv. Optical Mater.* 2014, 2, 373) successfully demonstrated materials design and fabrication processes of releasing ultrathin, microscale VCSELs (micro-VCSELs) from the growth wafer and incorporating them into arrays of interconnected devices over unlimited choices of non-native substrates including silicon, glass or a thin sheet of plastics without compromising intrinsic materials properties. While such novel device platforms of micro-VCSELs promise to accelerate accomplishing many unprecedented applications with unique advantages including programmable spatial layouts, efficient utilization of expensive epitaxial materials, as well as thin, lightweight, and flexible constructions, devices printed on a substrate with a low-to-moderate thermal conductivity exhibited a substantial reduction of the optical output power because of comparatively limited heat removal rate and resultant temperature increase in the laser cavity (D. Kang et al., *Adv. Optical Mater.* 2014, 2, 373; S. Matsuo et al., *Electron. Lett.* 1997, 33, 1148; H. Jeong and K. D. Choquette, 2013 *IEEE Photonics Conference*, Bellevue, 2013).

Although thermally-induced performance degradation is a common challenge for most solid-state devices working on plastics (M. Kaltenbrunner et al., *Nature* 2013, 499, 458; T. I. Kim et al., *Small* 2012, 8, 1643; K. Kuribara et al., *Nature Communications* 2012, 3; T. I. Kim et al., *Appl. Phys. Lett.* 2014, 104; Y. H. Li et al., *Proc. R. Soc. A* 2013, 469; Y. H. Li et al., *J. Appl. Phys.* 2013, 113), it becomes much more serious in VCSELs as it can lead to a complete shut-off of the device functionality due to the remarkably sensitive nature of lasing against the temperature variation of the cavity, associated with a spectral mismatch between emission of gain medium and cavity resonance at elevated temperatures (H. Jeong and K. D. Choquette, 2013 *IEEE Photonics Conference*, Bellevue, 2013; G. Hasnain et al., *IEEE J. Quantum Electron.* 1991, 27, 1377; R. A. Morgan et al., *Electron. Lett.* 1991, 27, 1400). Development of novel integration pathways to allow implementation of VCSELs in mechanically compliant formats without sacrificing their wafer-level performance is therefore critically important to realize the full potential of this technology for future applications in flexible and wearable optoelectronics.

SUMMARY

In one embodiment, a vertical cavity surface emitting laser (VCSEL) composite assembly is provided including a VCSEL, a substrate spaced from the VCSEL, and at least one metal layer disposed between the VCSEL and the substrate to facilitate efficient thermal management of the assembly.

In another embodiment, a vertical cavity surface emitting laser (VCSEL) composite assembly is provided including a VCSEL and a flexible substrate spaced from the VCSEL. A first metal layer is disposed on a bottom surface of the VCSEL and a second metal layer is disposed on a top surface of the substrate, wherein the first and second metal layers facilitate reducing thermal resistance of the assembly.

In another embodiment, a method of making a vertical cavity surface emitting laser (VCSEL) composite assembly is provided which includes providing a VCSEL, providing a substrate spaced from the VCSEL, and evaporating at least one metal layer between the VCSEL and the substrate.

BRIEF DESCRIPTION OF THE DRAWINGS

FIG. 1(a) is a schematic illustration of printed micro-VCSELs in thermally-engineered flexible composite assemblies, where a thin layer of metal is incorporated as a heat spreading medium between the active device and a polyethylene terephthalate (PET) substrate;

FIG. 1(b) shows cross-sectional scanning electron microscope (SEM) images and corresponding schematic illustrations of printed micro-VCSELs in three different configurations of composite assemblies, where a thin layer of metal (Cr/Ag/Au: 10 nm/1000 nm/30 nm) is evaporated underneath the bottom surface of released micro-VCSELs (referred to 'V-M-A-P', where V, M, A, P denote VCSEL, metal, adhesive, and polymeric substrate, respectively), on the front surface of a substrate (V-A-M-P), or on both (V-M-A-M-P);

FIGS. 1(a)-(b) are schematic illustrations of printed micro-VCSELs in thermally-engineered flexible composite assemblies, where a thin layer of metal is incorporated as a heat spreading medium between the active device and a polyethylene terephthalate (PET) substrate;

FIG. 1(c) shows cross-sectional scanning electron microscope (SEM) images and corresponding schematic illustrations of printed micro-VCSELs in three different configurations of composite assemblies, where a thin layer of metal (Cr/Ag/Au: 10 nm/11000 nm/30 nm) is evaporated underneath the bottom surface of released micro-VCSELs (referred to 'V-M-A-P', where V, M, A, P denote VCSEL metal, adhesive, and polymeric substrate, respectively), on the front surface of a substrate (V-A-M-P), or on both (V-MA-M-P);

FIG. 1(d) is a photographic image of 5×5 arrays of interconnected micro-VCSELs with an aperture area of ~22×22 μm$^2$ on a thermally-engineered flexible substrate (V-A-M-P), where micro-VCSELs are printed on square-shaped (1×1 mm$^2$) metal pads patterned on a PET substrate (~50 μm) mounted on a curved surface, where the insets show a corresponding photographic image of VCSEL illumination taken through IR viewer (FIND-R-SCOPE 84499A) and a magnified view of individual micro-VCSEL with metal interconnection;

FIG. 7 is a plot of total thermal resistance ($R_{tot}$) of an equivalent thermal circuit shown in FIG. 4(d) as a function of metal thickness ($t_m$).

DETAILED DESCRIPTION

Figure 2A:
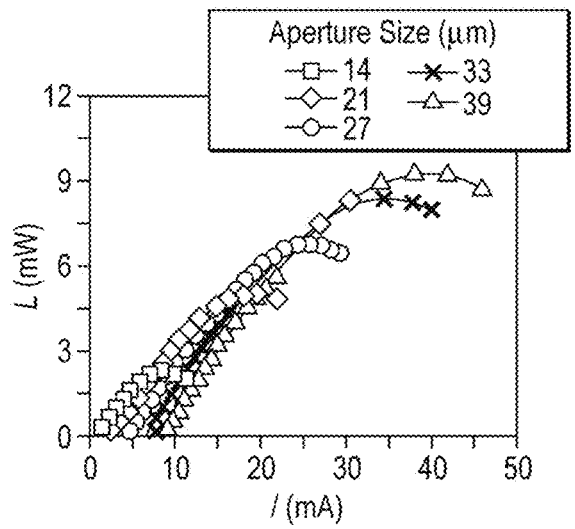
FIG. 2(a) is a graph of representative optical output power (L)-current (I) curves from micro-VCSELs lasing at 850 nm on the GaAs source wafer as a function of the size of square oxide aperture.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Embodiments disclosed herein present approaches that can overcome aforementioned performance limitations of printed micro-VCSELs on flexible substrates having intrinsically low thermal conductivities by exploiting thermally engineered composite assemblies. Experimental and theoretical studies highlight that the developed concept of materials design and device integration enables facile and efficient heat removal from micro-VCSELs printed on plastics and therefore allows the realization of performance characteristics that are comparable or even higher than those achievable on the source wafer, in manners that also preserve their benefits in mechanically flexible and optically transparent constructions.

This disclosure provides a novel integration pathway for flexible assemblies of micro-VCSELs to overcome limitations of thermally induced performance degradation on substrates of low thermal conductivity such as plastics. The incorporation of a thin metal layer as a heat spreading medium between the active device and target substrate enables significant reduction of effective thermal resistance of the system, which translates to the dramatic enhancement of heat removal efficiency and output characteristics of printed micro-VCSELs even at large aperture areas for high output power. Due to highly effective heat conduction and spreading, both the thickness and areal coverage of the integrated metal layer in composite assemblies of micro-VCSELs can be significantly reduced in the manner that minimally affects their intrinsic mechanical and optical properties. The approach presented herein therefore provides a realistic means to achieve high performance operation of micro-VCSELs on plastics as a new materials platform for integrated flexible optoelectronics, and can be readily applicable to a wide range of materials systems (e.g. silicon, III-V, organics) and device types (e.g. light emitting diodes, edge-emitting lasers, transistors) that can benefit from efficient thermal management without compromising their materials characteristics and device performance.

As compared to prior art approaches, embodiments disclosed herein provide transfer printing of VCSELs on unlimited choices of module substrates, programmable assemblies on a secondary substrate in layouts and areal coverages beyond those achievable on the source wafer in the conventional technology, efficient utilization of source materials (e.g., reduced materials losses from dicing, reuse of the growth substrate), operation of VCSELs on plastics at performances comparable or even higher than on the source wafer, minimal or low influence on the intrinsic mechanical and optical properties of substrate materials, and unlimited degrees of freedom to integrated VCSELs with disparate classes of materials and devices.

FIG. 1(a) shows a schematic illustration for printed arrays 100 of micro-VCSELs 10 in thermally engineered composite assemblies 12 that heterogeneously incorporate materials of high thermal conductivity between the VCSEL 10 and a polymeric substrate 14 to enable and facilitate an efficient thermal management. Specifically, at least one ultrathin (~a few μm) metal layer 16 is introduced on a top surface 18 of the flexible substrate 14 (i.e. a second metal layer), on a bottom surface 20 of the released micro-VCSEL 10 (i.e. a first metal layer), or on both, respectively, which are referred to as V-A-M-P, V-M-A-P, and V-M-A-M-P, respectively, where V, A, M, P denote micro-VCSEL 10, adhesive 22, metal 16, and polymeric substrate 14, respectively (FIG. 1(b)). Such advanced designs of flexible composite assemblies 12 for the efficient thermal management of printed micro-VCSELs permit dramatic improvement of output performance of devices operating on plastics while minimally affecting mechanical flexibility as well as the level of optical transparency in printed modules. FIG. 1(c) shows a photographic image of 5×5 arrays 100 of interconnected micro-VCSELs 10 integrated on a polyethylene terephthalate (PET) substrate mounted on a curved surface, with comparable output characteristics to devices on the source wafer even in a flexible and optically transparent format. This was enabled by the highly effective thermal management through the optimized V-A-M-P configuration of flexible composite assemblies 12, as will be described in detail subsequently.

Figure 2B:
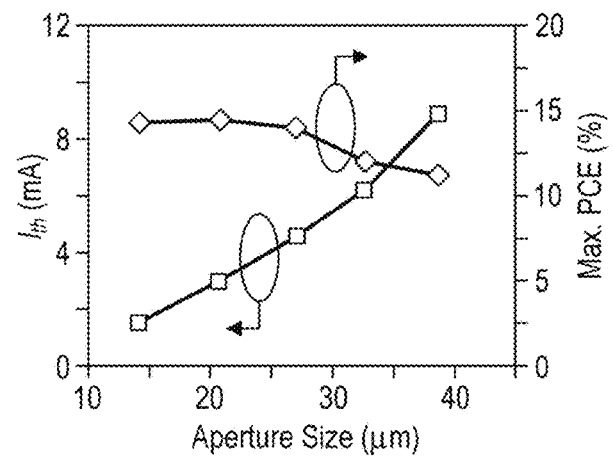
FIGS. 2(b)-(c) show corresponding plots of (b) threshold current ($I_{th}$) and maximum power conversion efficiency (PCE) and (c) current (I)-voltage (V) curves of micro-VCSELs at various aperture areas.

Under the given choice of substrate materials, thermal behaviors of printed micro-VCSELs are also affected by the design of laser cavity. Specifically, the level of maximum output power is closely related to the aperture area of VCSELs, which is known to sensitively affect the amount of heat flux generated from the device (M. Grabherr et al., *Electron. Lett.* 1996, 32, 1723; T. Wipiejewski et al., *IEEE Photonics Technol. Lett.* 1996, 8, 10). To examine this effect and establish baseline performance of devices, we first studied the dependence of output characteristics for micro-VCSELs upon the aperture area on a GaAs source wafer as well as after the printing on various target substrates. FIG. 2(a) depicts optical output power (L)-current (I) curves of micro-VCSELs on the source wafer at various areas of the square aperture formed by selective wet oxidation of $Al_{0.98}Ga_{0.02}As$ (K. D. Choquette et al., *IEEE J. Sel. Top. Quantum Electron.* 1997, 3, 916; K. D. Choquette et al., *IEEE Photonics Technol. Lett.* 1995, 7, 1237), where the area of top mesa was adjusted such that different aperture areas are created under the same oxidation condition (430° C., 50 min). The maximum output power of micro-VCSEL increased with an aperture size due to the increased area of current injection in the active region (M. Grabherr et al., *Electron. Lett.* 1996, 32, 1723; T. Wipiejewski et al., *IEEE Photonics Technol. Lett.* 1996, 8, 10). The enlarged aperture area also accompanied a reduced current density in the active region, which in turn led to the increase of both the threshold current for lasing and the current at the maximum output power (FIG. 2(b)).

Figure 2C:
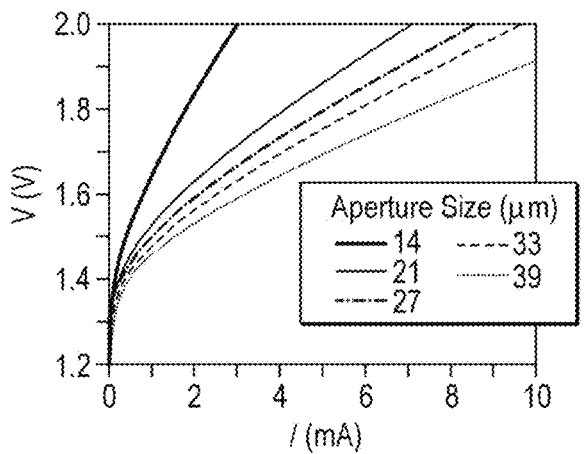
Figure 2D:
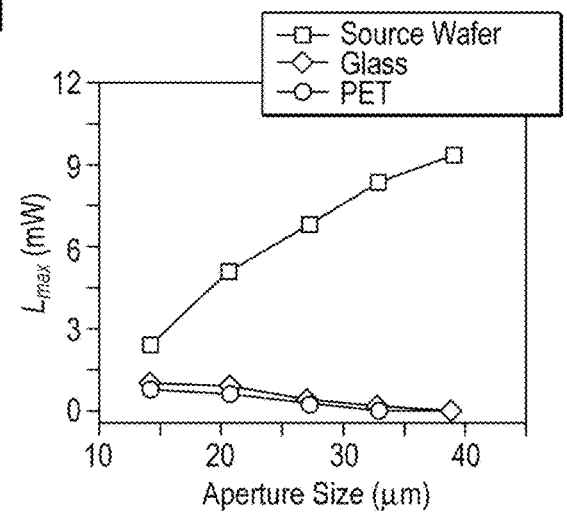
FIG. 2(d) illustrates maximum optical output power ($L_{max}$) from micro-VCSELs printed on glass and PET substrates, as well as on the source GaAs wafer at various aperture areas.

On the other hand, the corresponding maximum power conversion efficiency (PCE) remained almost the same or slightly decreased with an increasing aperture area, suggesting a larger amount of heat flux is generated during the current injection and contributes to the increase of the active region temperature at larger aperture areas. Such optical characteristics of micro-VCSELs are also consistent with the trend in current-voltage curves (FIG. 2(c)), where the voltage at a fixed driving current decreases at larger aperture areas due to geometrically- and thermally-induced reduction of series resistance in the active region and distributed Bragg reflectors (DBRs), respectively (K. Tai et al., *Appl. Phys. Lett.* 1990, 56, 2496; K. Kurihara et al., *J. Appl. Phys.* 1993, 73, 21). For measurements of device performance on foreign substrates, micro-VCSELs were released from the source wafer by selective removal of sacrificial layer ($Al_{0.95}Ga_{0.05}As$) and printed on glass (thickness: ~1 mm) and PET (thickness: ~50 μm) using a thin (~1 μm) layer of photocurable polymer as an organic adhesive (D. Kang et al., *Adv. Optical Mater.* 2014, 2, 373). The maximum output power ($L_{max}$) of micro-VCSELs with an aperture area of 14×14 μm$^2$ was ~2.4 mW on the source wafer, but substantially decreased to ~1.0 and ~0.75 mW when printed on glass and PET, respectively. The $L_{max}$ of printed micro-VCSELs on glass or PET continuously decreased as the aperture size increased until it became almost turned off at aperture areas greater than ~30×30 μm$^2$. Such severe deterioration of laser output power at larger aperture areas of micro-VCSELs was caused by the excessive amount of heat generation and resultant temperature increase in the laser cavity associated with the large thermal resistance of a target substrate (T. Wipiejewski et al., *IEEE Photonics Technol. Lett.* 1996, 8, 10).

Figure 3A:
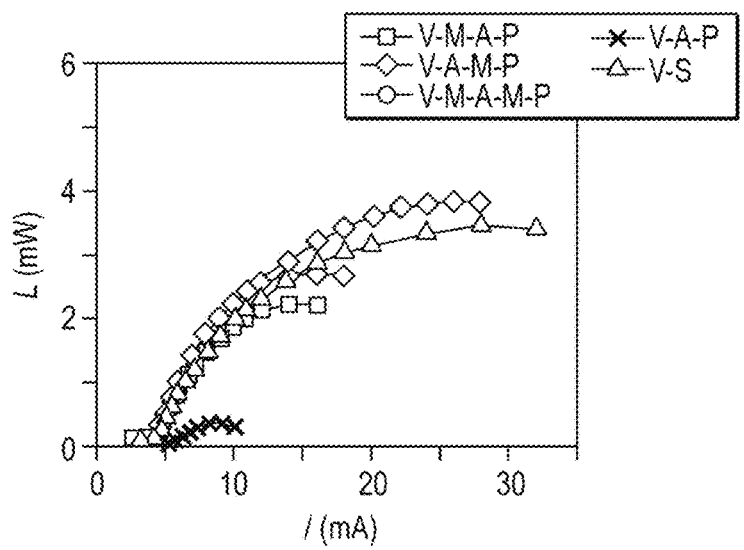
FIGS. 3(a)-(b) show representative curves of (a) optical output power (L)-current (I) and (b) voltage (V)-current (I) recorded from 850 nm micro-VCSELs with a square aperture of 22×22 μm$^2$ in various configurations of composite assemblies including VCSELs on the source wafer (referred to as V-S) and on a plain PET (V-A-P), where each metal layer includes Cr/Ag/Au (10 nm/3000 nm/30 nm)
Figure 3B:
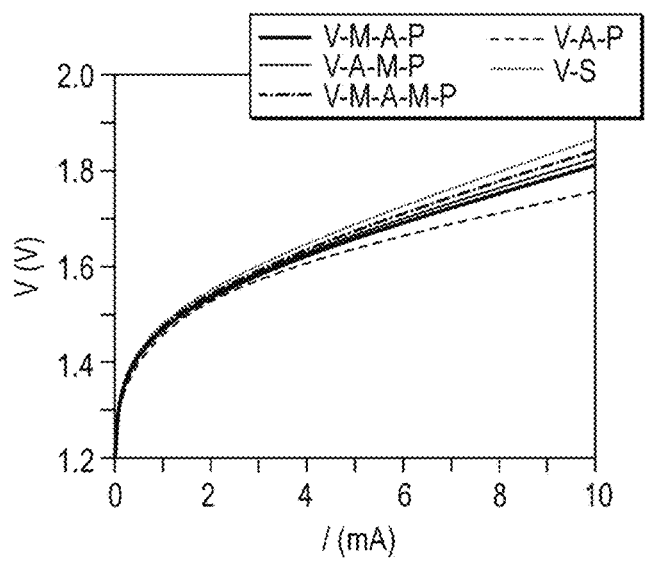

To address these difficulties in the operation of high power VCSELs on plastics, we newly introduced thermally engineered composite assemblies as a novel integration pathway for flexible micro-VCSELs, where materials of high thermal conductivity such as metals are heterogeneously incorporated to facilitate the efficient heat removal and thus greatly enhance output characteristics of micro-VCSELs. FIGS. 3(a) and 3(b) show optical power (L)-current (I) and voltage (V)-current (I) curves of micro-VCSELs with an aperture area of 22×22 μm$^2$ printed on a PET substrate, where sequentially evaporated Cr/Ag/Au (10 nm/3000 nm/30 nm) was employed as a metal (M) layer. Metals incorporated directly underneath the device as in V-M-A-P and V-M-A-M-P configurations were deposited after the release of micro-VCSELs from the growth wafer by an elastomeric stamp, where the bottom surface (i.e. $Al_{0.40}Ga_{0.60}As$ base layer) of micro-VCSELs was exposed and readily accessible for the subsequent metal evaporation. The performance of printed micro-VCSELs improved dramatically upon the introduction of ultrathin (~3 μm) metal layers between the released device and the polymeric substrate, in which maximum output power increased to ~2.2 mW (for V-M-A-P), ~2.7 mW (for V-A-M-P), and ~3.9 mW (for V-M-A-M-P). As expected, devices printed on a plain PET without the implementation of metal (referred to as V-A-P configuration) exhibited severely degraded output power (~0.4 mW). Corresponding current-voltage characteristics are also consistent with the observed trend (FIG. 3(b)).

Figure 3C:
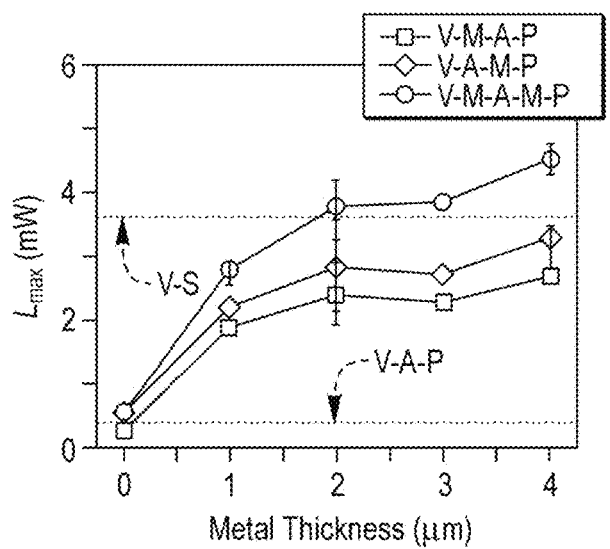
FIG. 3(c) illustrates maximum output power ($L_{max}$) of printed micro-VCSELs in various composite assemblies as a function of metal thickness (x; Cr/Ag/Au=10 nm/x nm/30 nm)

Given this remarkably favorable outcome of hybrid integration, we further systematically studied the effect of metal thickness on the performance of printed micro-VCSELs on PET with an aperture area of 22×22 μm² at various configurations of composite assemblies. As summarized in FIG. 3(c), the maximum output power of micro-VCSELs gradually increased with an increasing metal thickness, while the rate of increase diminished at metal thicknesses larger than ~2 μm. Consistent with FIG. 3(a), the V-M-A-M-P showed largest improvement in the maximum output power due to the most efficient heat removal enabled by double metal layers, while the V-A-M-P performed better than the V-M-A-P in all metal thicknesses studied here. It is noteworthy that devices in the V-M-A-M-P configuration showed even higher maximum output power than those on the source wafer.

Figure 5A:
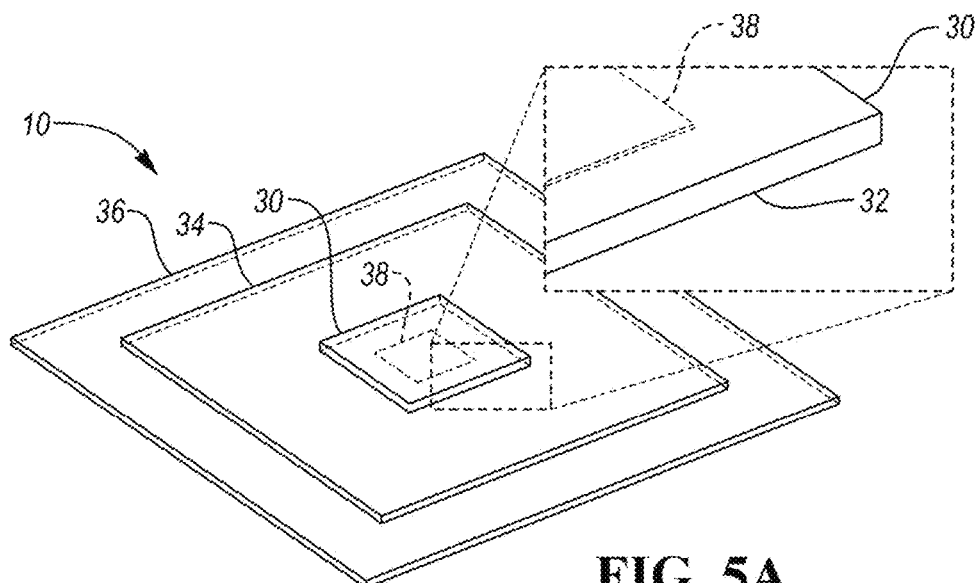
FIGS. 5(a) and 5(b) depicted a perspective and cross-sectional view, respectively, of the simulated layout of a printed micro-VCSEL on a PET substrate in the V-M-A-M-P configuration.
Figure 5B:
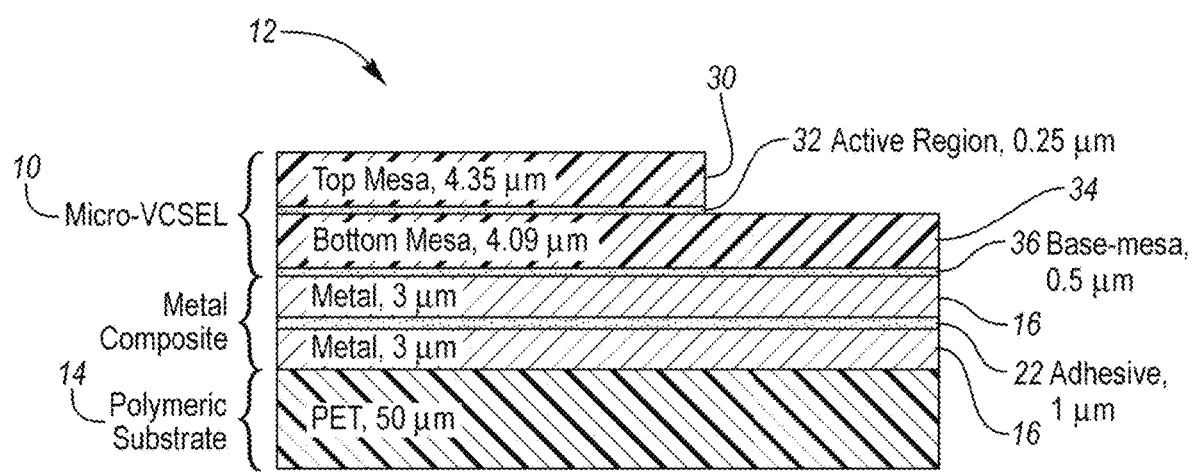
Figure 6A:
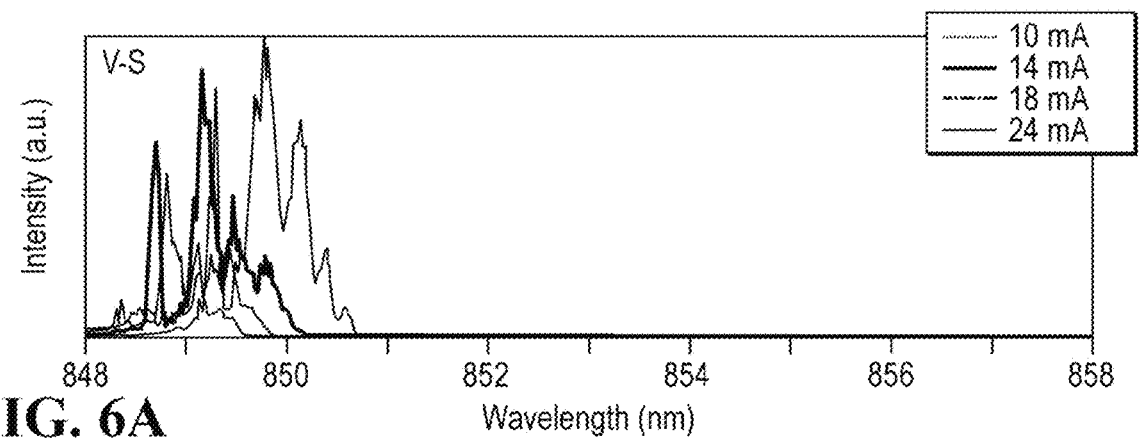
FIGS. 6(a)-(d) show representative lasing spectra of a 850 nm micro-VCSEL with 22×22 μm$^2$ square aperture at varying input currents (a) on source wafer (referred to as V-S) and in various configurations of composite assemblies such as (b) V-M-A-M-P, (c) V-A-M-P, and (d) V-M-A-P.
Figure 6B:
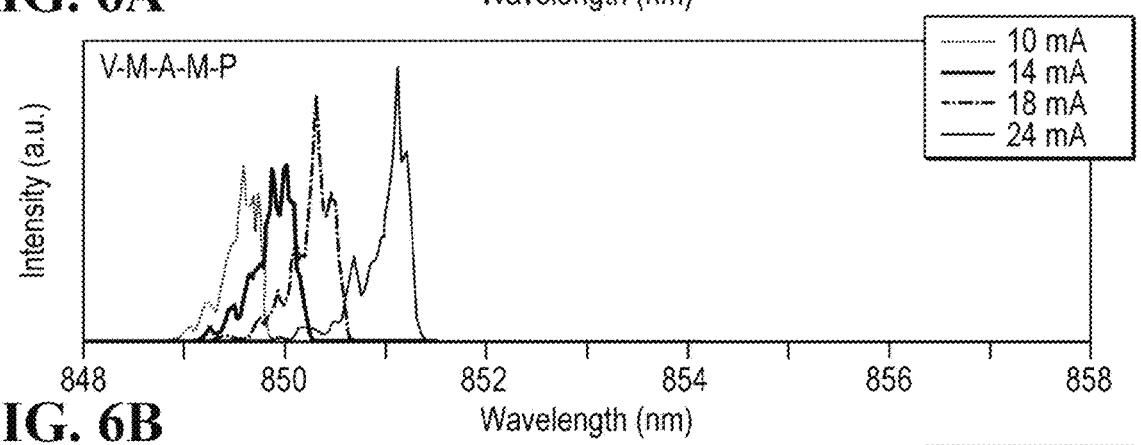
Figure 6C:
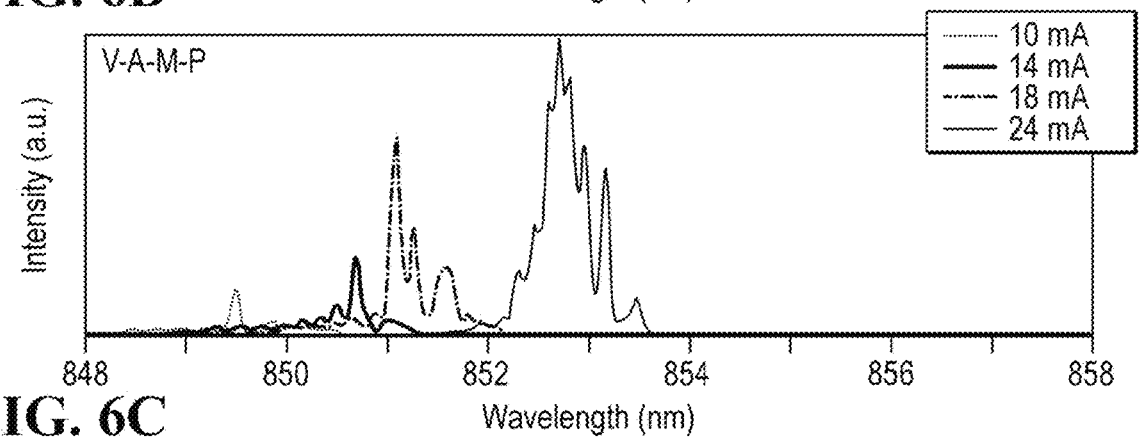
Figure 6D:
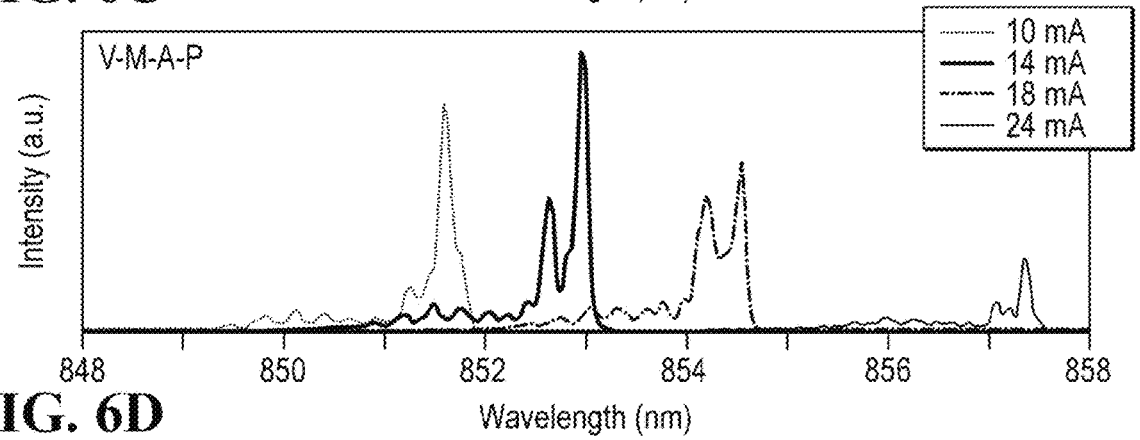

To elucidate the underlying mechanism of performance enhancement and identify optimal design rules for composite assemblies, we numerically studied heat transfer of printed micro-VCSELs on a PET substrate based on 3D finite element analysis (COMSOL Multiphysics™), where a micro-VCSEL 10 was modelled as a four-layer stack composed of top DBR 30, active region 32, bottom DBR 34, and base layer 36, wherein the aperture 38 is also depicted (FIG. 5). The steady-state temperature distribution of the entire device assemblies including micro-VCSEL 10, metal layers 16, and a substrate 14 were calculated after applying a single volumetric heat source within the active region 32 of the micro-VCSEL 10. More details of thermal modeling including simulated geometries and materials parameters appear at the end of the specification.

Figure 4A:
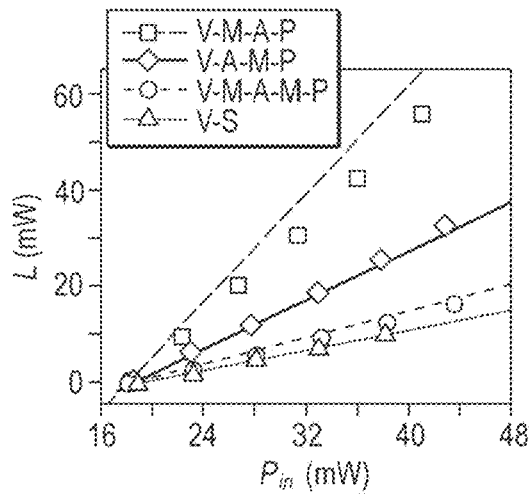
FIG. 4(a) depicts the calculated (dashed line) steady-state temperature increase ($\Delta T = T_{active} - T_{ambient}$, where $T_{active}$ and $T_{ambient}$ are steady-state temperature of the VCSEL's active region, and the temperature of an ambient air (=293.15K), respectively) of printed micro-VCSELs as a function of input thermal power, in which the thickness of metal layer (silver) and the area of substrate were fixed at 3 μm and 2000×2000 μm$^2$, respectively, where experimentally measured data (squares) were derived from the spectral shift (0.07 nm/K) of lasing modes of 850 nm micro-VCSELs, where the metal layer thickness is 3.04 μm (Cr/Ag/Au:10 nm/3000 nm/30 nm)

FIG. 4(a) presents calculated steady-state temperature increase ($\Delta T = T_{active} - T_{ambient}$, where $T_{active}$ and $T_{ambient}$ are steady-state temperature of the VCSEL's active region, and the temperature of an ambient air (=293.15K), respectively) of printed micro-VCSELs shown as dashed lines as a function of input thermal power, in which the thickness of metal (silver) layer and the area of substrate were fixed at 3 μm and 2000×2000 μm², respectively. The trend of temperature increase ($\Delta T$) with different configurations of composite assemblies is in accordance with the experimentally observed variation of maximum output power (FIG. 3(c)), where the V-M-A-P and V-M-A-M-P showed the highest and lowest active region temperatures at a fixed level of input power, respectively. Notably, the temperature of V-M-A-M-P was even slightly higher than on the source wafer even though it provided a larger output power (FIG. 3(c)), suggesting the observed performance enhancement is associated with the spectral design of laser cavity, where the cavity resonance was intentionally mismatched against the gain maximum at an ambient temperature (i.e. before the temperature increase of the laser cavity).

A thin metal layer incorporated between micro-VCSEL and substrate acts as a heat spreading medium to enlarge the effective area of thermal conduction through the PET substrate, which is equivalent to the reduction of effective thermal resistance of the system compared with the layout lacking metal implementation (i.e. V-A-P). Since the area covered by the metal layer on the substrate (i.e. V-A-M-P) is larger than the area of metal directly underneath the VCSEL (i.e. V-M-A-P), the heat spreading capability and corresponding reduction of thermal resistance is more effective, resulting in the comparatively lower temperature in the active region for the V-A-M-P configuration. In a similar manner, employing dual layers of metal (i.e. V-M-A-M-P) can further reduce the effective thermal resistance of the system and the temperature of the laser cavity.

Figure 4B:
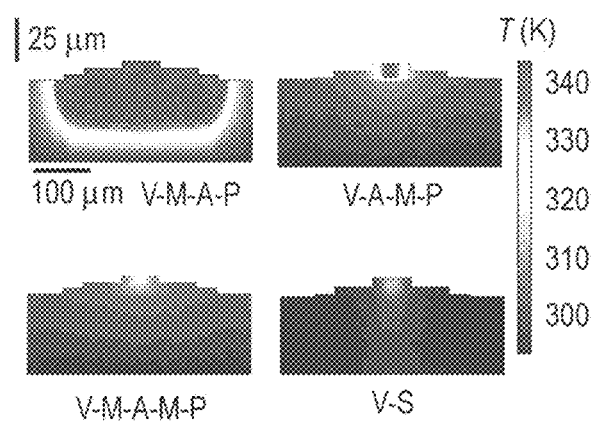
FIG. 4(b) shows contour plots of steady-state cross-sectional temperature distribution of printed micro-VCSELs, where the metal thickness and the input thermal power were fixed at 3 μm of Ag and 40 mW, respectively.
Figure 4C:
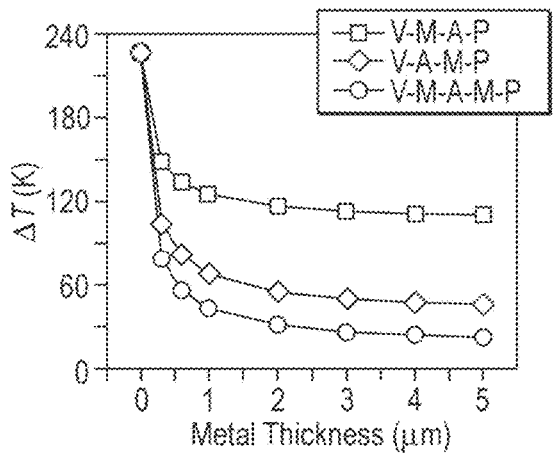
FIG. 4(c) depicts the calculated steady-state temperature increase in the active region at various composite assemblies as a function of metal thickness under a fixed volumetric heat source (40 mW)

The conclusion emerging from this discussion is also consistent with the steady-state temperature distribution of printed micro-VCSELs (FIG. 4(b)), where the role of thin metal layers to facilitate efficient heat removal is evidently shown. Notably, calculated slopes of temperature increase showed reasonable agreement with those derived from experimentally measured spectral shift (~0.07 nm $K^{-1}$) of lasing modes (FIG. 6), thereby validating the use of this established numerical model to further evaluate geometrical aspects of metal layers and obtain optimal designs of flexible composite assemblies for printed micro-VCSELs. Small discrepancies might be attributed to the uncertainty in the spatial distribution of heat source, non-unity power conversion efficiency, as well as optical and electrical losses during measurements. Accordingly, we examined the influence of metal layer thickness on the temperature of active region at a constant level of volumetric heat flux (40 mW/(33×33× 0.25 μm³)). Consistent with measured performance variation with different metal thicknesses (FIG. 3(c)), the steady-state temperature of the active region showed a steep increase to reach a common maximum (i.e. corresponding to V-A-P) as the thickness of metal approaches to zero in all three configurations, while it varies much less sensitively at metal thicknesses beyond ~2 μm (FIG. 4(c)).

Figure 4D:
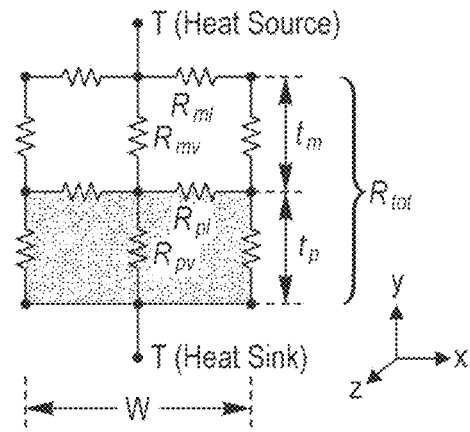
FIG. 4(d) is a schematic illustration of a simplified equivalent thermal circuit for a printed micro-VCSEL, where the metal and PET layers were modeled by series- and parallel-connected thermal resistors to capture both the conduction in the vertical direction as well as the effect of heat spreading in lateral directions, where $R_{mv}$ ($R_{pv}$) and $R_{ml}$ ($R_{pl}$) are vertical and lateral components of thermal resistance in the metal (PET) layer, respectively.

Such dependence of device temperature upon the thickness of metal layer inserted between the VCSEL and a PET substrate can be also qualitatively understood by considering a simplified mathematical model of equivalent thermal circuit as illustrated in FIG. 4(d), where it was assumed that thermal conduction occurs between the micro-VCSEL (as a heat source of constant heat flux) and the bottom surface of the PET substrate (as a heat sink of constant temperature) through thermally resistive layers of metal and PET that have the same width (W). The metal and PET layers were modeled by series- and parallel-connected thermal resistors to capture both the heat conduction in the vertical (y) direction as well as the effect of heat spreading in the lateral (x) direction, where $R_{mv}$ ($R_{pv}$) and $R_{ml}$ ($R_{pl}$) are vertical and lateral components of thermal resistance in the metal (PET) layer, respectively. Assuming steady-state thermal conduction at a constant level of heat dissipation rate (Q (W)), the total resistance ($R_{tot}$ (K/W)) is related to the Q and temperature difference between the heat source ($T_{heat\,source}$) and heat sink ($T_{heat\,sink}$) by the following equation (B. M. Guenin et al., IEEE Trans. Compon., Packag., Manuf. Technol., Part A 1995, 18, 749; P. Sabounchi and A. Heydari, Annu. IEEE Semicond. Therm. Meas. Manage. Symp 2003, 151):

$$QR_{tot} = \Delta T = T_{heat\,source} - T_{heat\,sink} \qquad (1)$$

The total resistance ($R_{tot}$) can be analytically obtained by:

$$R_{tot} = \frac{R_{mv}^2(3R_{pv}+R_{pl}) + R_{mv}R_{ml}(3R_{pv}+R_{pl}) + R_{mv}(2R_{pl}R_{pv}+3R_{pv}^2) + R_{ml}(R_{pv}R_{pl}+R_{pv}^2) + R_{pl}R_{pv}^2}{3R_{mv}(3R_{pv}+R_{pl}) + R_{ml}(3R_{pv}+R_{pl}) + 3R_{pv}R_{pl}} \quad (2)$$

As the thickness ($t_m$) of metal layer approaches zero, $R_{mv}$ (~$t_m$) becomes very small (≈0) while $R_{ml}$ (~$1/t_m$) gets very large (≈∞), implying that the heat spreading in the metal layer would be severely limited with decreasing $t_m$. Consequently, the $R_{tot}$ would increase with decreasing metal thicknesses (FIG. 7) and approaches to a maximum value that corresponds to the configuration without the metal incorporation (i.e. V-A-P):

$$R_{tot} = \frac{(R_{pv}R_{pl}+R_{pv}^2)}{(3R_{pv}+R_{pl})} \quad (3)$$

On the other hand, in case that the metal thickness increases, $R_{ml}$ (~$1/t_m$) decreases such that the heat spreading is highly effective. In this regime, the influence of metal thickness on the total thermal resistance is not significant since the contribution from the PET is much larger than that from the metal in the thickness range studied here, which therefore results in much less sensitivity of the active region temperature to the thickness of metal (FIG. 4(c)).

Figure 4E:
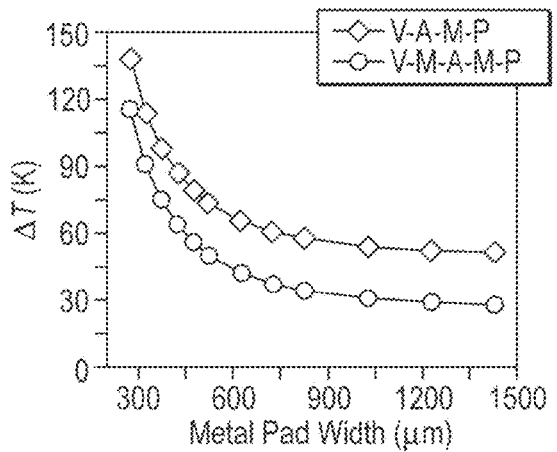
FIG. 4(e) shows the calculated steady-state temperature increase in the active region in V-A-M-P and V-M-A-M-P configurations as a function of the width of square-shaped metal pad patterned on the substrate under a fixed volumetric heat source (40 mW), where the metal thickness and the input power were fixed at 3 μm and 40 mW, respectively.
Figure 4F:
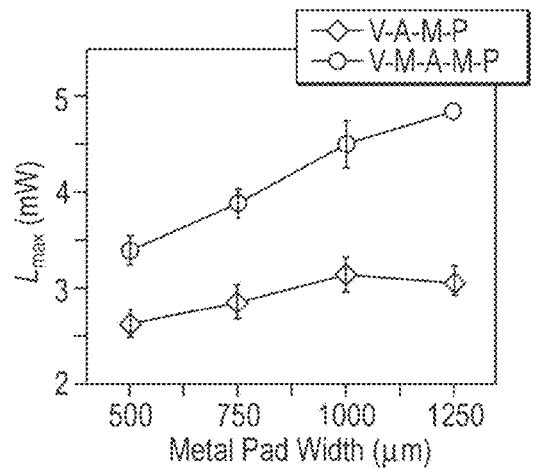
FIG. 4(f) illustrates the corresponding experimentally measured maximum output power ($L_{max}$) of printed micro-VCSELs in V-A-M-P and V-M-A-M-P configurations as a function of metal pad width at a constant thickness of metal (Cr/Ag/Au; 10 nm/3000 nm/30 nm)

Owing to the highly efficient heat conduction in the metal layer, a full areal coverage of metals on the PET as in V-A-M-P and V-M-A-M-P configurations is not strictly demanded for the efficient heat removal, especially for applications where micro-VCSELs are sparsely distributed to act as a point heat source. Furthermore, such layouts that accommodate a minimum metal coverage provide practical benefits as they minimally affect optical transparency as well as mechanical flexibility of the device assembly. Accordingly, we studied the effect of square-shaped metal-pad area formed on a PET substrate upon the active region temperature of devices in V-A-M-P and V-M-A-M-P configurations at a constant thickness (~3 μm) of each metal layer. As summarized in FIG. 4(e), the calculated temperature in the active region decreases as the metal-pad area increases yet with a clear saturation behavior, implying that a limited metal-pad area on the PET substrate can still provide a comparable effect to the layout with a full areal coverage for the efficient heat spreading and performance enhancement. The calculated active region temperature becomes almost insensitive to the metal-pad area as it gets larger than ~1 mm², which is also quantitatively consistent with experimentally measured output characteristics (FIG. 4(f)).

In summary, we demonstrated a novel integration pathway for flexible assemblies of micro-VCSELs to overcome limitations of thermally induced performance degradation on substrates of low thermal conductivity such as plastics. The incorporation of a thin metal layer as a heat spreading medium between the active device and target substrate enabled significant reduction of effective thermal resistance of the system, which translated to the dramatic enhancement of heat removal efficiency and output characteristics of printed micro-VCSELs even at large aperture areas for high output power. Due to highly effective heat conduction and spreading, both the thickness and areal coverage of the integrated metal layer in composite assemblies of micro-VCSELs can be significantly reduced in the manner that minimally affects their intrinsic mechanical and optical properties. The results presented here therefore provide a realistic means to achieve high performance operation of micro-VCSELs on plastics as a new materials platform for integrated flexible optoelectronics, and can be readily applicable to a wide range of materials systems (e.g. silicon, III-V, organics) and device types (e.g. light emitting diodes, edge-emitting lasers, transistors) that can benefit from efficient thermal management without compromising their materials characteristics and device performance.

Fabrication of Composite Assemblies of 850 nm Micro-VCSELs:

Epitaxial assemblies of releasable 850 nm micro-VCSELs were grown on a (100) n-type GaAs substrate by metal organic vapor phase epitaxy (MOVPE) as described in detail in our previous work (D. Kang et al., *Adv. Optical Mater.* 2014, 2, 373, incorporated by reference herein). Briefly, fabrication of micro-VCSELs began with the deposition of p-type metal contact (Pt/Ti/Pt/Au), followed by dry etching to form a square top-mesa structure. The area (14×14-39×39 μm²) of the square-shaped oxide aperture was varied by adjusting the area of top-mesa while the selective wet oxidation of $Al_{0.98}Ga_{0.02}As$ was performed under the same condition (430° C. for 50 min) for all samples. An n-type metal contact (AuGe/Ni/Au) was formed on the exposed abrupt $Al_{0.15}Ga_{0.85}As$ layer in the bottom distributed Bragg reflector. A bottom- and a base-mesa structure were sequentially defined by dry and wet chemical etching, respectively, followed by undercut etching to selectively remove the sacrificial layer in diluted HCl to generate fully-functional arrays of micro-VCSELs on the GaAs source wafer. An elastomeric polydimethylsiloxane (PDMS) stamp with a micron-sized feature (350×350×100 μm³) was used to release and print an individual micro-VCSEL on a target substrate using a thin (~1 μm) photocurable polymeric adhesive (T. I. Kim et al., *Chem. Mater.* 2014, 26, 3502). For V-M-A-P and V-M-A-M-P configurations, a thin metal layer (Cr/Ag/Au) was deposited on the exposed bottom surface of released micro-VCSEL before transfer printing. Complete details of fabrication procedures appear at the end of the specification.

Electrical and Optical Characterization of Micro-VCSELs:

Electrical properties of micro-VCSELs were obtained on a metallic probing stage (Micromanipulator) as a heat sink without additional active cooling, using a semiconductor parameter analyzer (4156C, Agilent Technologies). Calibrated photodiode detector (PD300R, Ophir Optronics) was used to measure the output power of lasing collected through an objective lens (8×, N.A.=0.15). The lasing spectra of the micro-VCSELs were recorded by an optical spectrum analyzer (71450B, Hewlett-Packard) through a multi-mode optical fiber with the core diameter of 105 μm. The SEM images were obtained using a low-vacuum field emission scanning electron microscope (JSM 7001F, JEOL).

Numerical Modeling of Heat Transfer in Printed Micro-VCSELs:

A three-dimensional (3D) finite element analysis (FEA) model of heat transfer was developed to calculate the change of the active region temperature of printed micro-VCSEL using COMSOL Multiphysics™ software, where a single volumetric heat source was applied at the center of the active region. A natural convection boundary condition with an ambient air (h=25 W/(m²·K) and $T_{ext}$=293.15K) was assumed on all solid-air interfaces except at the bottom of the PET substrate where a constant temperature boundary condition (293.15K) was assumed as a heat sink. Detailed geometries and materials parameters used in the simulation are included below.

According to a non-limiting embodiment, the processing scheme for printed micro-VCSELs in composite assemblies is provided below.

Top Contact (p$^+$) Metallization

1. Clean a 12×12-mm$^2$ piece of 850 nm VCSEL source wafer with acetone, isopropyl alcohol (IPA), and deinoized (DI) water.
2. Dehydrate at 110° C. for 10 min.
3. Spin-coat photoresist (PR; AZ5214 (Clariant); 500 rpm/5 s, 3000 rpm/30 s) and soft-bake PR at 110° C. for 1 min.
4. Expose PR with i-line (365 nm, 80 mJ/cm$^2$) mask aligner (Karl Suss MJB3).
5. Develop PR in tetramethyl ammonium hydroxide (TMAH)-based developer (AZ300MIF (Clariant) for 40 s.
6. Descum the exposed GaAs top contact layer by oxygen reactive-ion etching (O$_2$-RIE; Plasmalab; 10 W, 100 mTorr, 1 min).
7. Remove a native oxide layer in a diluted HCl solution (HCl (38 wt %, EMD):DI water=1:1, by volume) for 1 min.
8. Deposit Pt (10 nm)/Ti (40 nm)/Pt (10 nm)/Au (80 nm) by electron beam evaporation (Temescal).
9. Lift-off PR in warm acetone for 1 hr.

Top-Mesa Etching

10. Clean the processed wafer in step 9 using acetone, IPA, and DI water.
11. Deposit Si$_3$N$_4$ (~1.3 μm) by plasma-enhanced chemical vapor deposition (PECVD; Plasmalab; SiH$_4$:NH$_3$:N$_2$=40:20:60 in standard cubic centimeters (sccm), 500 mTorr, 38 W, 300° C.).
12. Clean the sample using acetone, IPA, and DI water and dehydrate at 110° C. for 5 min.
13. Treat hexamethyldisilazane (HMDS (98%, Acros Organics)) for 5 min as an adhesion promoter and pattern PR (AZ5214) (step 3-5).
14. Etch Si$_3$N$_4$ using CF$_4$/O$_2$-RIE (CF$_4$/O$_2$=50.9/5.1 in a. u., 100 mTorr, 100 W) until the GaAs contact layer is exposed.
15. Strip PR with acetone.
16. Descum the exposed surface of GaAs contact layer by oxygen reactive-ion etching (O$_2$—RIE; Plasmalab; 100 W, 100 mTorr, 1 min).
17. Etch top-mesa structure with inductively coupled plasma reactive ion etching (ICP-RIE; STS; BCl$_3$:N$_2$=1.5:9 in sccm, 5 mTorr, platen/coil=100 W/500 W, 100° C.).

Wet Oxidation for Current Confinement Aperture

18. Load the processed wafer in step 17 into a furnace pre-heated at 430° C. for 50 min and filled with water steam vapor that is generated from a water bath heated at 90° C. and carried by 3.5 slpm of N$_2$ gas.
19. Strip remaining Si$_3$N$_4$ by CF$_4$/O$_2$-RIE for 1 min (step 14).

Bottom-Contact (n$^+$) Metallization

20. Clean the processed wafer in step 19 using acetone, IPA, and DI water and dehydrate at 110° C. for 5 min.
21. Treat HMDS for 10 min.
22. Spin-coat PR (AZ4620 (Clariant); 500 rpm/5 s, 3000 rpm/60 s).
23. Soft-bake at room temperature for 30 min and then at 110° C. for 5 min.
24. Expose PR with i-line (365 nm, 600 mJ/cm$^2$) mask aligner (Karl Suss MJB3).
25. Develop PR in aqueous base developer (AZ400K (Clariant):DI water=1:4, by volume) for 4 min.
26. Post-bake PR at 110° C. for 5 min.
27. Etch an oxidized surface with developer (AZ400K:DI water=1:4, by volume) for 5 min, followed by diluted NH$_4$OH solution (NH$_4$OH (28-30%, Fisher Scientific):DI=1:10, by volume) for 1 min.
28. Etch a layer of Al$_{0.9}$Ga$_{0.1}$As in diluted HF solution (HF (48%, EMD):DI=1:10, by volume) for 20 s.
29. Etch a layer of Al$_{0.15}$Ga$_{0.85}$As in a mixture of citric acid solution (100 g of citric acid monohydrate (Sigma-Aldrich) in 83 ml of DI water) and H$_2$O$_2$ (30%, Fisher Scientific) (20:1, by volume) for 2 min.
30. Etch a layer of Al$_{0.9}$Ga$_{0.1}$As in diluted HF solution (HF:DI=1:10, by volume) for 20 s.
31. Strip PR using acetone.
32. Clean the processed wafer in step 31 using acetone, IPA, and DI water and dehydrate at 110° C. for 5 min.
33. Pattern PR (AZ5214), descum, and remove an oxide layer (step 3-7).
34. Deposit AuGe (100 nm)/Ni (30 nm)/Au (100 nm) by electron beam evaporation.
35. Lift-off PR in warm acetone for 1 hr.
36. Anneal the sample at 400° C. for 1 min under H$_2$ (2%)/N$_2$ atmosphere by rapid thermal annealing.

Bottom-Mesa Etching

37. Clean the processed wafer in step 38 using acetone, IPA, and DI water.
38. Deposit Si$_3$N$_4$ (1.3 μm) by PECVD (step 11).
39. Clean the sample, treat HMDS, and pattern PR (AZ4620) (step 20-25).
40. Etch a Si$_3$N$_4$ mask, strip PR, and descum the exposed surface (step 14-16).
41. Etch bottom-mesa structure by ICP-RIE such that the etch stops at the base layer (step 17)
42. Strip Si$_3$N$_4$ by CF$_4$/O$_2$-RIE for 1 min (step 19).

Base-Mesa and Sacrificial Layer Partial Etching

43. Clean the processed wafer in step 42 using acetone, IPA, and DI water and dehydrate at 110° C. for 5 min.
44. Treat HMDS and pattern PR (AZ4620) (step 21-26).
45. Remove oxide in a diluted HCl solution (HCl:DI water=1:1, by volume) for 1 min.
46. Etch the base-mesa structure in a mixture of citric acid solution (step 29) and H$_2$O$_2$ (20:1, by volume) for 6 min.
47. Partially etch the Al$_{0.95}$Ga$_{0.05}$As sacrificial layer in a diluted HF solution (HF:DI=1:10, by volume) for 25 s.
48. Strip PR using acetone.

PR Anchoring and Undercut Etching

49. Clean the processed wafer in step 48 using acetone, IPA, and DI water and dehydrate at 110° C. for 10 min.
50. Treat HMDS for 10 min.
51. Spin-coat PR (SPR 220-7 (Rohm and Hass), 500 rpm/5 s, 2000 rpm/60 s).
52. Soft-bake at room temperature for 30 min, at 90° C. for 5 min, and subsequently at 115° C. for 5 min.
53. Expose PR with i-line (365 nm, 650 mJ/cm$^2$) mask aligner (Karl Suss MJB3).
54. Develop PR in aqueous base developer (MF-24A (Microchem Corp.)) for 3 min.
55. Post-bake PR at 90° C. for 1 min and 110° C. for 3 min.
56. Remove oxide in a diluted HCl solution (HCl:DI water=1:1, by volume) for 30 s.
57. Etch etch-holes through the base-mesa in a mixture of phosphoric acid, DI water and H$_2$O$_2$ (H$_3$PO$_4$ (85%, Fisher Scientific):DI water:H$_2$O$_2$=1:12:13, by volume) for 1 min.
58. Etch Al$_{0.95}$Ga$_{0.05}$As sacrificial layer in a diluted HCl solution (HCl:DI=3:1, by volume) for 70 min.

Preparation of Featured Elastomeric Polydimethylsiloxane (PDMS) Stamps

59. Clean a 10×10-mm² piece of Si (100) wafer with acetone, IPA, DI water, and then RCA1 solution (NH$_4$OH:H$_2$O$_2$:H$_2$O=1:1:6, by volume, 75° C.) for 10 min, followed by strip of a natural oxide with buffered oxide etchant (BOE (6:1, Transene)).

60. Dehydrate at 200° C. for 5 min.

61. Spin-coat PR (SU-8 50 (Microchem Corp.); 500 rpm/5 s, 2000 rpm/30 s).

62. Soft-bake at room temperature for 30 min, at 65° C. for 80 min, and then at 95° C. for 110 min.

63. Expose PR with i-line (365 nm, 360 mJ/cm²) mask aligner (Karl Suss MJB3).

64. Post-exposure-bake (PEB) PR at 65° C. for 1 min and 95° C. for 7 min.

65. Develop PR in SU-8 developer (Microchem Corp.) for 9 min.

66. Hard-bake PR at 150° C. for 1 hr.

67. Clean the prepared mold in step 66 with acetone, IPA, and DI water and dehydrate at 110° C. for 10 min.

68. Treat under the atmosphere of tridecafluoroctyl-trichlorosilane (United Chemical Technology) for 30 min.

69. Cast PDMS pre-polymer (Sylgard 184, Dow Corning; pre-polymer:curing agent=10:1, by weight).

70. Cure PDMS pre-polymer at room temperature for 1 day and at 65° C. for 1 hr.

71. Slowly peel cured PDMS off from the mold

Liftoff and Transfer-Printing of a Micro-VCSEL onto a Thermally Engineered PET Substrate 72. Pick-up a micro-VCSEL from source wafer prepared in step 58 using a featured PDMS stamp (step 71).

73. Clean a polyethylene terephthalate (PET) substrate (~50 μm-thick) by acetone, IPA, and DI water.

74. Deposit Cr (10 nm)/Ag (x nm)/Au (30 nm) by electron beam evaporation on the rear surface of the base-mesa of the lifted micro-VCSEL in step 72, on the PET substrate in step 73, or on both.

75. Clean the processed PET substrate in step either 73 or 74 with acetone, IPA, and DI water.

76. Dehydrate at 110° C. for 5 min.

77. Spin-coat UV-curable adhesive (500 rpm/5 s, 2000 rpm/30 s).

78. Soft-bake at 110° C. for 90 s.

79. Print a micro-VCSEL which was ready at step either 72 or 74 onto the PET substrate in step 78.

80. Cure the adhesive layer under UV illumination for 30 min and then on a hot plate at 110° C. for 30 min.

81. Strip PR with acetone.

Interconnection of Printed Micro-VCSELs

82. Clean the processed sample in step 81 using acetone, IPA, and DI water and dehydrate at 110° C. for 5 min.

83. Treat UV ozone (UVO) for 10 min.

84. Spin-coat PR (SU-8 2005 (Microchem Corp.); 600 rpm/5 s, 3000 rpm/30 s).

85. Prebake PR at 95° C. for 3 min.

86. Expose PR with i-line (365 nm, 140 mJ/cm²) mask aligner (Karl Suss MJB3).

87. PEB PR at 95° C. for 2 min 30 s.

88. Develop PR in SU-8 developer (Microchem Corp.) for 2 min.

89. Hard-bake PR at 110° C. for 1 h.

90. Treat UV ozone (UVO) for 30 min.

91. Spin-coat PR (SU-8 2 (Microchem Corp.); 600 rpm/5 s, 3000 rpm/30 s).

92. Prebake PR at 65° C. for 1 min and then 95° C. for 1 min.

93. Expose PR with i-line (365 nm, 80 mJ/cm²) mask aligner (Karl Suss MJB3).

94. PEB PR at 65° C. for 1 min and then 95° C. for 1 min.

95. Develop PR in SU-8 developer (Microchem Corp.) for 30 s.

96. Hard-bake PR at 110° C. for 1 h.

97. Clean the sample using acetone, IPA, and DI water and dehydrate at 110° C. for 10 min.

98. Treat HMDS for 10 min.

99. Spin-coat PR (AZnLOF 2070 (Clariant); 4000 rpm/30 s).

100. Soft-bake PR at 100° C. for 7 min.

101. Expose PR with i-line (365 nm, 500 mJ/cm²) mask aligner (Karl Suss MJB3).

102. PEB PR at 110° C. for 45 s.

103. Develop PR in aqueous base developer (AZ300 MIF) for 90 s.

104. Deposit Cr (30 nm)/Cu (600 nm)/Cr (100 nm) using a DC sputtering system (AJA Orion5; Ar: 15.0 sccm, 3 mTorr, 50 W).

105. Lift-off PR in warm acetone for 20 min.

106. Clean the sample using acetone, IPA, and DI water and pattern PR (SU-8 2005) for encapsulation (step 83-89).

3D FEA Modeling of Thermal Dissipation of Printed Micro-VCSELs

A three-dimensional (3D) finite element analysis (FEA) model of heat transfer was developed to calculate the change of the active region temperature of printed micro-VCSEL in various composite assemblies studied herein. We first established a 3-D geometry of printed micro-VCSELs with an aperture area of 22×22 μm² in the heat transfer module of COMSOL Multiphysics™ software, where a micro-VCSEL was modelled as a four-layer stack composed of top distributed Bragg reflector (DBR), active region, bottom DBR, and base layer (FIG. 5). Simulated micro-VCSELs have the same geometry as experimental systems, whose detailed dimensions are summarized in Table 1 below:

TABLE 1

| Material | Width (μm) | Thickness (μm) | Thermal conductivity in lateral/vertical direction (W/(m · K)) |
| --- | --- | --- | --- |
| top mesa | 70 | 4.35 | 19.93/17.82 |
| active region | 70 | 0.25 | 11.59/11.27 |
| bottom mesa | 204 | 4.09 | 21.14/20.06 |
| base mesa | 276 | 0.50 | 3.95 |
| silver (on base mesa) | 276 | Varied | 429 |
| adhesive | 2000 | 1.00 | 0.4 |
| silver (on substrate) | 2000 | Varied | 429 |
| PET substrate | 2000 | 50 | 0.2 |

The governing equations for steady-state heat conduction and convection used in this study are expressed by (H. K. Lee et al., *Sol. Stat. Electron.* 2009, 53, 1086):

$$-\nabla \cdot (k \nabla T) = Q \qquad (4)$$

$$k \nabla T = h(T_{ext} - T) \qquad (5)$$

where k is the thermal conductivity, Q is the heat generated per unit volume, T is the temperature, h is the convective heat transfer coefficient, and $T_{ext}$ is the temperature of surrounding medium. A single volumetric heat source of Q is applied at the center (33×33×0.25 μm³) of the active region, where the volume of heat source was adjusted considering the effect of the additional joule heating in top- and bottom-DBRs in actual devices. A natural convection boundary condition with an ambient air (h=25 W/(m²K) and $T_{ext}$=293.15K) was assumed on interfaces between air and VCSEL, air and metal, and air and adhesive, while a constant temperature boundary condition (293.15K) was assumed at the bottom of the PET substrate as a heat sink. Top-DBR, active region, and bottom DBR were modelled as a uniform medium that have anisotropic (i.e. vertical and lateral) thermal conductivities. Their average thermal conductivities in vertical and lateral directions were obtained analytically by (H. K. Lee et al., *Sol. Stat. Electron.* 2009, 53, 1086; M. Osinski and W. Nakwaski, *Electron. Lett.* 1993, 29, 1015):

$$k_{lateral} = (k_1 d_1 + k_2 d_2 + k_3 d_3 + \ldots)/(d_1 + d_2 + d_3 + \ldots) \quad (6)$$

$$k_{vertical} = (d_1 + d_2 + d_3 + \ldots)/(d_1/k_1 + d_2/k_2 + d_3/k_3 + \ldots) \quad (7)$$

where $d_i$ and $k_i$ are the thickness and thermal conductivity of constituting layers, respectively. The thermal conductivity of $Al_xGa_{1-x}As$ at varying Al compositions were obtained according to the following equation (S. Adachi, *J. Appl. Phys.* 1985, 58, R1; M. Osinski et al., *Proc. SPIE* 1994, 2147, 85):

$$k(x) = (0.0227 + 0.2883x - 0.30x^2)^{-1} \text{ W/(m·K)} \quad (8)$$

Thermal conductivities for all materials used in this numerical modeling are listed in Table 1 above.

Dependence of Total Thermal Resistance ($R_{tot}$) on Metal Thickness ($t_m$)

The total thermal resistance ($R_{tot}$) of an equivalent thermal circuit shown in FIG. 4(*d*) can be analytically calculated by:

$$R_{tot} = \frac{R_{mv}^2(3R_{pv} + R_{pl}) + R_{mv}R_{ml}(3R_{pv} + R_{pl}) + R_{mv}(2R_{pl}R_{pv} + 3R_{pv}^2) + R_{ml}(R_{pv}R_{pl} + R_{pv}^2) + R_{pl}R_{pv}^2}{3R_{mv}(3R_{pv} + R_{pl}) + R_{ml}(3R_{pv} + R_{pl}) + 3R_{pv}R_{pl}} \quad (9)$$

where $R_{mv}$ ($R_{pv}$) and $R_{ml}$ ($R_{pl}$) are vertical and lateral components of thermal resistance in the metal (PET) layer, respectively. Each resistance term is estimated using the following equations $$R_{mv} = \frac{t_m}{k_m(W/3)h} \quad (10)$$

$$R_{ml} = \frac{(W/2)}{k_m t_m h} \quad (11)$$

$$R_{pv} = \frac{t_p}{k_p(W/3)h} \quad (12)$$

$$R_{pl} = \frac{(W/2)}{k_p t_p h} \quad (13)$$

where $t_m$ ($t_p$) and $k_m$ ($k_p$) are the thickness and thermal conductivity of the metal (PET) layer, and W and h are width in the x- and z-direction, respectively. Consistent with FEA modeling and experimental results, the $R_{tot}$ steeply increases with decreasing $t_m$ as illustrated in FIG. 7, where all parameters except $t_m$ were fixed at constant values as summarized in Table 2 below:

TABLE 2

| Material | W, h (μm) | t (μm) | k (W/(m · K)) |
|---|---|---|---|
| metal | 2000 | Varied | 429 |
| PET substrate | 2000 | 50 | 0.2 |

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vertical cavity surface emitting laser (VCSEL) composite assembly, comprising:
   a VCSEL comprising a top mesa structure including a top distributed Bragg reflector and a bottom mesa structure including a bottom distributed Bragg reflector;
   a substrate spaced from the VCSEL;
   at least one metal layer disposed between the VCSEL and the substrate to facilitate efficient thermal management of the VCSEL composite assembly;
   a cured photocurable adhesive disposed between the substrate and the at least one metal layer; and
   a base layer interposed between the bottom distributed Bragg reflector and the at least one metal layer wherein the base layer stops etching.

2. The assembly of claim 1, wherein the substrate is constructed from a flexible material.

3. The assembly of claim 1, wherein the substrate includes a polymeric material.

4. The assembly of claim 3, wherein the substrate comprises polyethylene terephthalate (PET).

5. The assembly of claim 1, wherein a thickness of the at least one metal layer is about 3 μm.

6. The assembly of claim 1, wherein the at least one metal layer includes layers of Cr, Ag and Au.

7. The assembly of claim 1, wherein the at least one metal layer is disposed on a top surface of the substrate.

8. The assembly of claim 1, wherein the at least one metal layer is disposed on a bottom surface of the VCSEL.

9. The assembly of claim 1 wherein the base layer is an aluminum gallium arsenide base layer.

10. A vertical cavity surface emitting laser (VCSEL) composite assembly, comprising:
    a VCSEL comprising a top mesa structure including a top distributed Bragg reflector and a bottom mesa structure including a bottom distributed Bragg reflector;
    a flexible substrate spaced from the VCSEL;
    a first metal layer disposed on a bottom surface of the VCSEL; and
    a second metal layer disposed on a top surface of the flexible substrate, wherein the first and second metal layers facilitate reducing thermal resistance of the assembly;
    a cured polymeric adhesive layer disposed between the first metal layer and the second metal layer; and
    a base layer interposed between the bottom distributed Bragg reflector and the first metal layer wherein the base layer stops etching.

11. The assembly of claim 10, wherein the flexible substrate includes a polymeric material.

12. The assembly of claim 11, wherein the flexible substrate comprises polyethylene terephthalate (PET).

13. The assembly of claim 10, wherein a thickness of the first metal layer is about 3 μm.

14. The assembly of claim 10, wherein the first and second metal layers includes layers of Cr, Ag and Au.

15. The assembly of claim 10 wherein the base layer is a $Al_{0.40}Ga_{0.60}As$ base layer.

16. A method of making a vertical cavity surface emitting laser (VCSEL) composite assembly, comprising:

forming a top mesa structure by etching a GaAs VCSEL source wafer, the GaAs VCSEL source water including epitaxial growth VCSEL assemblies, the top mesa structure being defined by a first photoresist layer;

forming a bottom mesa structure by etching the GaAs VCSEL source wafer wherein etching stops at a base layer, the bottom mesa structure being defined by a second photoresist layer;

removing a sacrificial layer from the GaAs VCSEL source wafer thereby allowing separation of an epitaxial growth VCSEL assembly from the GaAs VCSEL source wafer:

picking up the epitaxial growth VCSEL assembly from the GaAs VCSEL source wafer with an elastomeric stamp;

depositing a first metal layer on a bottom surface of the epitaxial growth VCSEL assembly while it is held by the elastomeric stamp to form the VCSEL composite assembly:

coating the first metal layer with a photocurable polymeric adhesive;

printing the VCSEL composite assembly on a flexible substrate with the photocurable polymeric adhesive contacting the flexible substrate; and curing the photocurable polymeric adhesive to form a cured polymeric adhesive layer.

17. The method of claim 16, wherein a second metal layer is evaporated on a top surface of the flexible substrate such that the cured polymeric adhesive layer is positioned between the first metal layer and the second metal layer.

18. The method of claim 16, wherein the first metal layer is evaporated on the bottom surface of the VCSEL.

19. The method of claim 16 wherein a top metal layer is deposited over a p-type contact layer of the GaAs VCSEL source wafer prior to forming the top mesa structure.

20. The method of claim 16 wherein the flexible substrate includes a polymeric material.

21. The method of claim 20, wherein the flexible substrate comprises polyethylene terephthalate (PET).

22. The method of claim 16, wherein the first metal layer includes layers of Cr, Ag and Au.

23. The method of claim 16 wherein the elastomeric stamp includes polydimethylsiloxane.

24. A device comprising:
an elastomeric stamp; and a
vertical cavity surface emitting laser (VCSEL) composite assembly being held by the elastomeric stamp, the VCSEL composite assembly comprising:
a VCSEL composing a top mesa structure that includes a top distributed Bragg reflector and a bottom mesa structure that includes a bottom distributed Bragg reflector;
a first metal layer disposed a bottom surface of the VCSEL;
a photocurable adhesive layer disposed on the first metal layer wherein the photocurable adhesive layer is exposed from the elastomeric stamp thereby allowing the VCSEL composite assembly is be printed on a substrate; and
a base layer interposed between the bottom distributed Bragg reflector and the first metal layer wherein the base layer stops etching.

25. The device of claim 24 wherein the elastomeric stamp includes polydimethylsiloxane.

26. The device of claim 24, wherein the first metal layer includes layers of Cr, Ag and Au.

* * * * *